United States Patent
Klein et al.

(10) Patent No.: US 7,564,723 B2
(45) Date of Patent: Jul. 21, 2009

(54) REDUCING CURRENT CONSUMPTION FOR INPUT CIRCUIT OF AN ELECTRONIC CIRCUIT

(75) Inventors: Ralf Klein, München (DE); Ullrich Menczigar, Vaterstetten (DE)

(73) Assignee: Infineon Technologies AG, Munich (DE)

( * ) Notice: Subject to any disclaimer, the term of this patent is extended or adjusted under 35 U.S.C. 154(b) by 496 days.

(21) Appl. No.: 11/093,870

(22) Filed: Mar. 30, 2005

(65) Prior Publication Data

US 2005/0239433 A1    Oct. 27, 2005

(30) Foreign Application Priority Data

Mar. 30, 2004    (DE)    ............ 10 2004 015 318

(51) Int. Cl.
*G11C 7/00*    (2006.01)
(52) U.S. Cl. .............. 365/189.05; 326/82; 455/343.1
(58) Field of Classification Search ............ 365/189.05, 365/207, 227; 326/86, 90, 82; 455/217, 455/296, 334, 341, 343.1
See application file for complete search history.

(56) References Cited

U.S. PATENT DOCUMENTS

| | | | | | |
|---|---|---|---|---|---|
| 5,793,680 | A | * | 8/1998 | Okajima | ............ 365/189.05 |
| 6,058,063 | A | * | 5/2000 | Jang | ................ 365/189.05 |
| 6,327,190 | B1 | * | 12/2001 | Kim et al. | .......... 365/189.05 |
| 6,864,725 | B2 | * | 3/2005 | Cowles et al. | ............ 327/108 |
| 7,355,450 | B1 | * | 4/2008 | Smith | ................... 326/83 |
| 2005/0041451 | A1 | * | 2/2005 | Seo et al. | .................. 365/1 |

OTHER PUBLICATIONS

German Patent Office Examination Report dated Dec. 21, 2004.

* cited by examiner

*Primary Examiner*—Blane J Jackson
(74) *Attorney, Agent, or Firm*—Patterson & Sheridan, L.L.P.

(57) ABSTRACT

The invention relates to an input circuit for an electronic circuit, for receiving and assessing an input signal and for driving the input signal to a downstream circuit. The input circuit includes a first reception circuit which is configured to receive and drive the input signal and has a first current consumption characteristic, the current consumption of the first reception circuit depending on the input signal to be driven, a second reception circuit which is configured to receive and drive the input signal and has a second current consumption characteristic, the current consumption of the second reception circuit depending on the input signal to be driven, wherein the first reception circuit and the second reception circuit may be activated separately, and a control circuit configured to activate either the first reception circuit or the second reception circuit and to deactivate the respective other reception circuit on the basis of the driven input signal.

16 Claims, 5 Drawing Sheets

Voltages IN, OUT and input current as a function of the input voltage

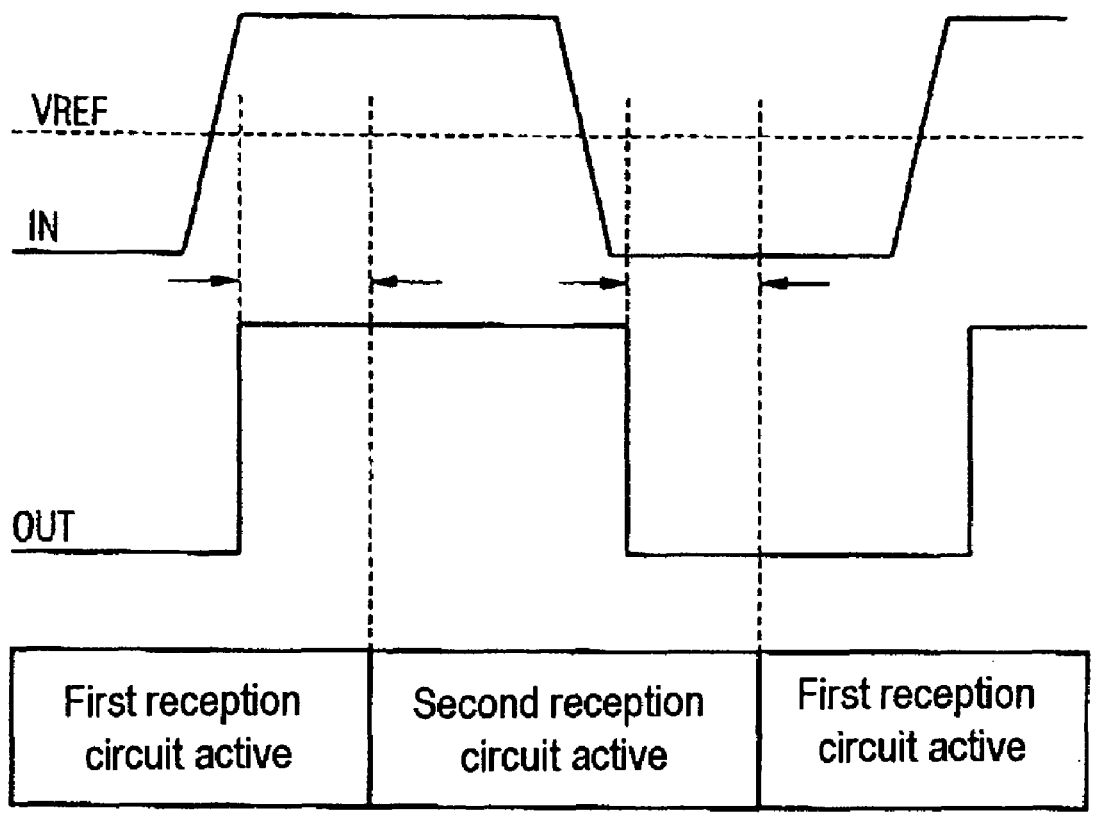

REDUCING CURRENT CONSUMPTION FOR INPUT CIRCUIT OF AN ELECTRONIC CIRCUIT

CROSS-REFERENCE TO RELATED APPLICATIONS

This application claims foreign priority benefits under 35 U.S.C. §119 to co-pending German patent application number DE 10 2004 015 318.3-55, filed 30 Mar. 2004. This related patent application is herein incorporated by reference in its entirety.

BACKGROUND OF THE INVENTION

1. Field of the Invention

The invention relates to an input circuit for an electronic circuit, in particular to an input circuit for an integrated circuit such as, for example, an integrated memory circuit.

2. Description of the Related Art

Digital integrated circuits such as memory modules, for example, communicate with other integrated circuits using signals on lines, wherein the electrical potential of the signals contains the information. The signals are, for example, data, address, clock and/or other signals. To receive and assess the signals which have been externally applied to the integrated circuit, input circuits are provided in the integrated circuits. In general, the potential of the applied signal is compared with a second voltage (which, as a reference voltage, may be constant or may be in antiphase with the input signal) to assign a state level to the result of the comparison. Input circuits contribute, to a great extent, to the current consumption of an integrated circuit, and thus, it is desirable, particularly in the case of applications which are critical in terms of current consumption, to reduce the current consumption of the input circuits of an integrated circuit. In addition, in conventional input circuits, it is not possible to separately set the timing response for detecting the rising and falling edges of the input signal.

Therefore, there is a need to provide an input circuit which can be used to reduce the current consumption and additionally, to set the timing response in a more specific manner.

SUMMARY OF THE INVENTION

In accordance with a first aspect of the present invention, an input circuit for an electronic circuit is provided for receiving and assessing an input signal and for driving the input signal to a downstream circuit. The input circuit has a first reception circuit configured to receive and drive the input signal and has a first current consumption characteristic, the current consumption of the first reception circuit depending on the input signal to be driven. The input circuit furthermore has a second reception circuit configured to receive and drive the input signal and has a second current consumption characteristic, the current consumption of the second reception circuit depending on the input signal to be driven. The first and second reception circuits may be respectively activated, separately from one another. A control circuit activates either the first reception circuit or the second reception circuit on the basis of the current consumption of the first and second reception circuits in the case of the input signal to be driven.

As a result of the reception circuits having different current consumption characteristics, the reception circuit having the lower current consumption may be selected on the basis of the input signal, and the respective other reception circuit is deactivated. Since driving the applied input signal gives rise to a different current consumption of the reception circuit when driving a logic "1" and a logic "0", one reception circuit may be selected for driving a low signal level, and another reception circuit may be selected for driving a high signal level, in order to optimize the current consumption.

In accordance with one preferred embodiment, the control circuit may have a first switch for switching the first reception circuit and a second switch for switching the second reception circuit.

The first and/or second reception circuit may respectively have a differential amplifier stage and a current mirror, the differential amplifier stage having a reference voltage connection and an input signal connection to assess the input signal with respect to an applied reference voltage. The differential amplifier stage of the first reception circuit may be formed with n-channel field effect transistors, and the current mirror circuit of the first reception circuit may be formed with p-channel field effect transistors. The differential amplifier stage of the second reception circuit may be formed with p-channel field effect transistors, and the current mirror circuit of the second reception circuit may be formed with n-channel field effect transistors.

In one embodiment, the differential amplifier stage of the first reception circuit is connected to a high supply potential, and the current mirror circuit of the first reception circuit is connected to a low supply potential. The differential amplifier stage of the second reception circuit may be connected to the low supply potential, and the current mirror circuit of the second reception circuit may be connected to the high supply potential.

In accordance with another embodiment, the first switch may be in the form of an n-channel field effect transistor which is arranged between the low supply potential and the differential amplifier stage of the first reception circuit. In a corresponding manner, the second switch may be in the form of a p-channel field effect transistor which is arranged between the high supply potential and the differential amplifier stage of the second reception circuit.

In particular, the non-inverted driven input signal which is taken from the output of the input circuit is utilized to control the n-channel field effect transistor designed as the first switch and the p-channel field effect transistor designed as the second switch.

The control circuit may have a delay element for activating either the first reception circuit or the second reception circuit, after a predetermined delay time, on the basis of the driven input signal.

In accordance with one embodiment of the invention, the first and/or the second reception circuit may have a driver circuit which can be switched to be inactive or active on the basis of the driven input signal.

The respective driver circuit may be switched to high impedance in the inactive state.

In accordance with another aspect of the present invention, a method is provided for receiving and assessing an input signal and for driving the input signal to a downstream circuit. In one embodiment, the input signal is received both by a first reception circuit having a first current consumption characteristic, the current consumption of the first reception circuit depending on the input signal to be driven, and by a second reception circuit having a second current consumption characteristic, the current consumption of the second reception circuit depending on the input signal to be driven. One of the first and the second reception circuit is activated on the basis of the driven input signal while the respective other reception circuit is deactivated.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 5 shows a timing diagram illustrating the activation of the respective reception circuit in the input circuit.

DETAILED DESCRIPTION OF THE PREFERRED EMBODIMENT

Figure 1A:
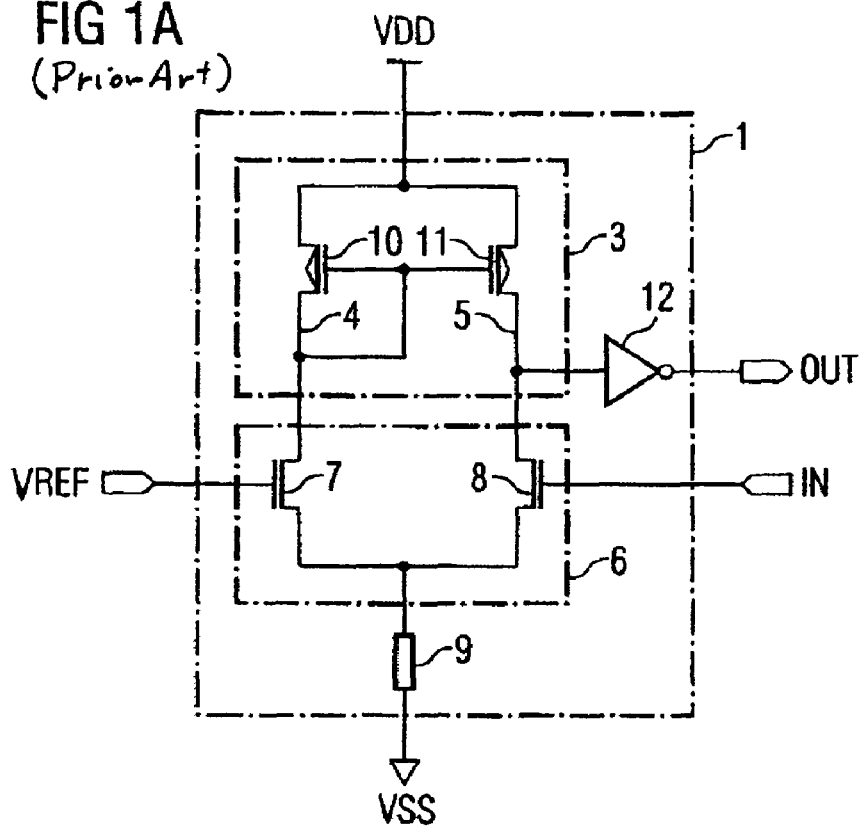
FIG. 1a shows a reception circuit for an input circuit having a differential amplifier which has n-channel field effect transistors.
Figure 1B:
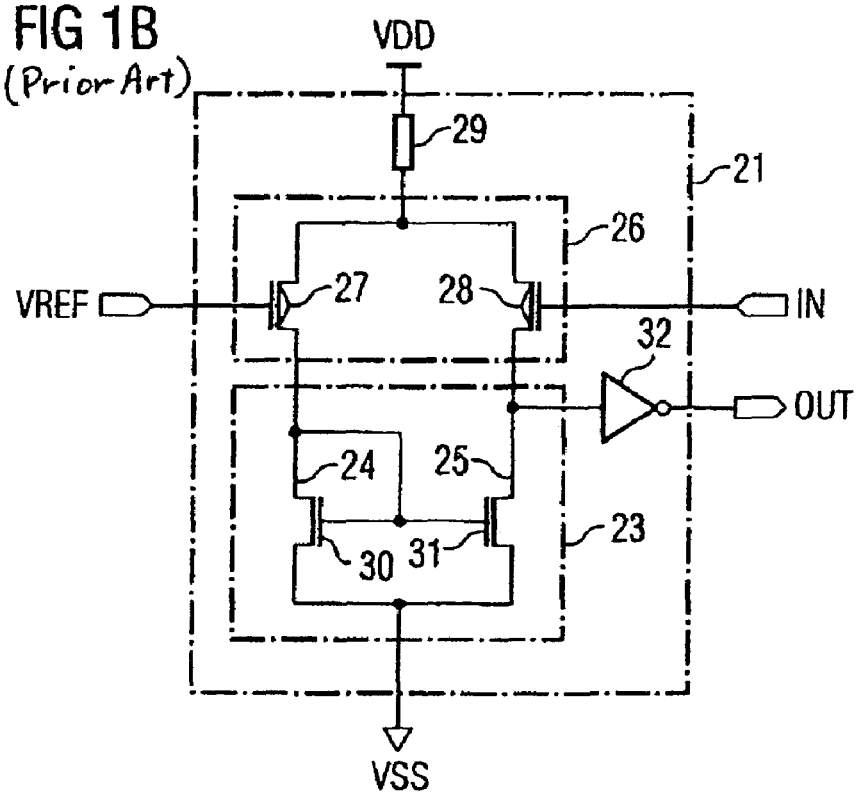
FIG. 1b shows another reception circuit for an input circuit which has a differential amplifier having p-channel field effect transistors.

FIGS. 1a and 1b show reception circuits (in accordance with the prior art) which are usually used as an input circuit. The reception circuits shown are usually used in integrated circuits for receiving input signals and assessing the input signals. Both reception circuits may be used in an input circuit according to one embodiment of the invention which will be described further below with reference to FIG. 3. The design and operation of the input circuits will be described in more detail below with reference to the input circuits shown in FIGS. 1a and 1b.

FIG. 1a shows a first reception circuit 1 for receiving and assessing the input signal. The reception circuit 1 has a current mirror circuit 3 which mirrors a current in a reference current path 4 into a mirror current path 5. The current mirror circuit 3 is coupled to a differential amplifier circuit 6 which has a first n-channel transistor 7 and a second n-channel transistor 8. The first n-channel transistor 7 is arranged in the reference current path 4. A control input of the first n-channel field effect transistor 7 is connected to a reference voltage $V_{REF}$. The second n-channel field effect transistor 8 is arranged in the mirror current path 5, and the input voltage is applied to the control input of the second n-channel field effect transistor 8. The source connections of the first and second n-channel field effect transistors 7, 8 are connected to a low supply voltage potential VSS via a resistor 9.

The current mirror circuit 3 may be designed in a known manner with a first and a second p-channel field effect transistors 10, 11, the source connections of the first and second p-channel field effect transistors 10, 11 being connected to a high supply voltage potential VDD. The gate connections of the p-channel field effect transistors 10, 11 of the current mirror circuit 3 are connected to a drain connection of the first p-channel field effect transistor 10 and of the first n-channel transistor 7. In this manner, the current in the reference current path 4 is mirrored into the mirror current path 5.

On the basis of the input signal that is applied to the gate input of the second n-channel field effect transistor 8, an intermediate signal (which is assessed in a corresponding manner) may be tapped off at the drain connections of the second n-channel field effect transistor 8 and of the second p-channel field effect transistor 11. The intermediate signal is applied to an input of a driver circuit 12 which applies the input signal to be driven to an output of the input circuit 1.

FIG. 1b shows an alternative design of a reception circuit. In an analogous manner to the reception circuit 1 shown in FIG. 1a, the reception circuit 21 comprises a current mirror circuit 23 having a reference current path 24 and a mirror current path 25. A differential amplifier circuit 26 which has a first p-channel field effect transistor 27 and a second p-channel field effect transistor 28 is provided and may have a complementary design to the differential amplifier circuit of FIG. 1a. The source connections of the first and second p-channel field effect transistors 27, 28 are connected to the high supply voltage potential VDD via a resistor 29.

The current mirror circuit 23 has a first n-channel field effect transistor 30 and a second n-channel field effect transistor 31, the source connections of which being connected to the low supply voltage potential VSS. The gate connections of the first and second n-channel field effect transistors 30, 31 are connected to the drain connections of the first p-channel field effect transistor 27 and of the first n-channel field effect transistor 30. The input signal which is applied to the second p-channel field effect transistor 28 is assessed in the differential amplifier circuit 26, and the input signal which has been assessed is provided as an intermediate signal to the output of the reception circuit which is formed by the drain connections of the second p-channel field effect transistor 28 and of the second n-channel field effect transistor 31. The intermediate signal is applied to an input of a driver circuit 32 which inverts the intermediate signal and applies the driven input signal to an output of the reception circuit 21. The reference voltage $V_{REF}$ is applied to the gate connection of the first p-channel field effect transistor 27.

The reception circuits 1, 21 shown in FIG. 1a and FIG. 1b are generally of analogous design to one another and have respective complementary field effect transistors. The current consumption characteristics of the two reception circuits therefore differ from one another.

Figure 2:
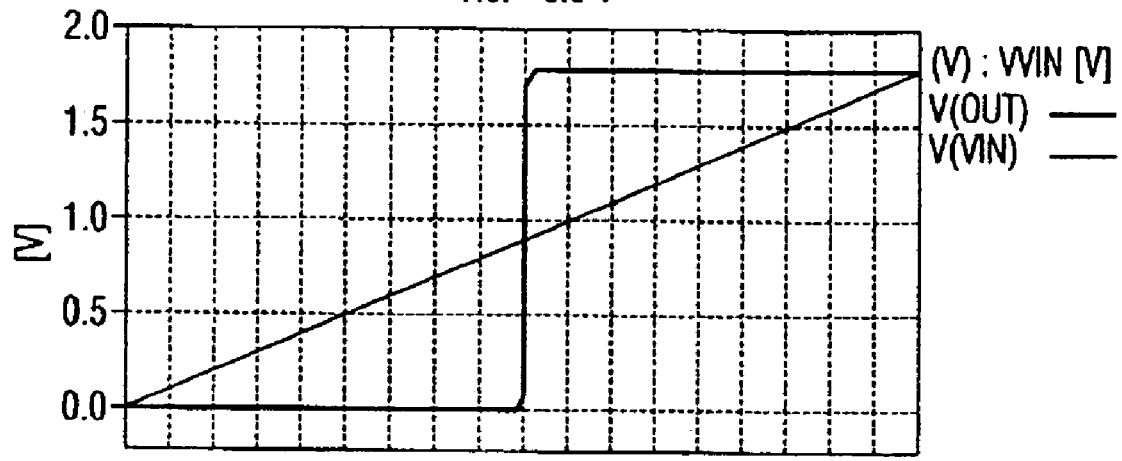
FIG. 2 shows a graph of the current consumption of the reception circuit shown in FIG. 1a for input voltages of between 0 and 1.8 V.
Figure 2:
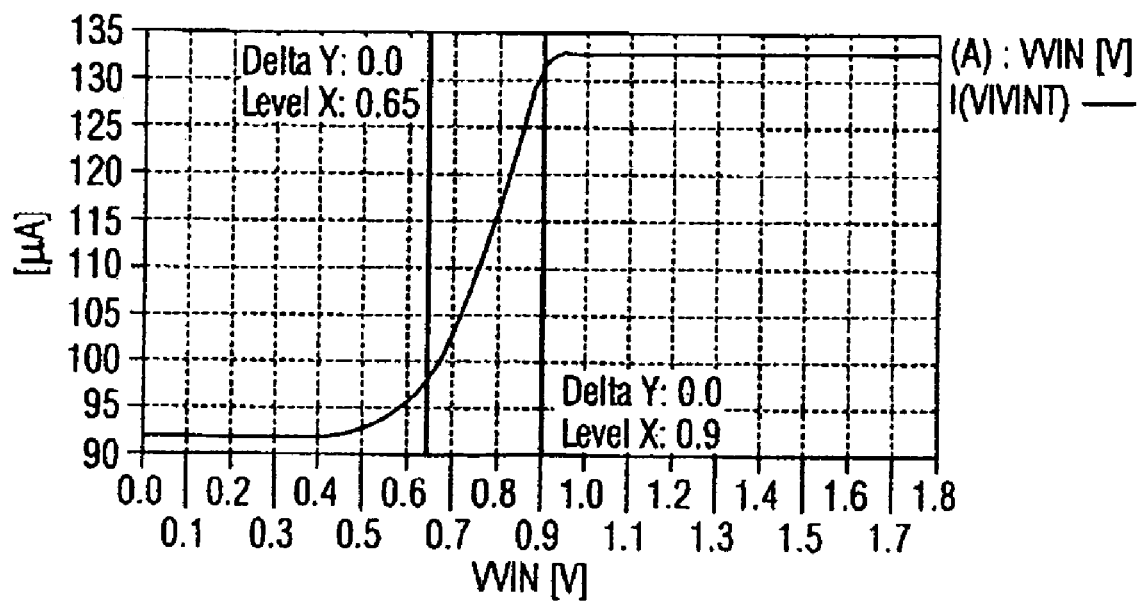

FIG. 2 shows the current consumption characteristic of the input circuit shown in FIG. 1a. The upper graph shows a voltage profile (which results from an input voltage that varies between 0 and 1.8 V) of the output voltage for an exemplary reception circuit which is designed in accordance with FIG. 1a and to which a reference voltage of 0.9 V is applied. The lower graph correspondingly shows the current consumption at the supply voltage connections, which current consumption results from the applied input signal and from the output signal that is output. It is evident that different current consumption levels of the reception circuit result for different states of the output signal level. Whereas a current consumption of approximately 92 μA results when an input signal having a low state level is applied, the current consumption rises to approximately 133 μA when a high state level is to be output. In view of the fact that an integrated circuit generally has a large number of reception circuits of this type or of a comparable type, a considerable current consumption that depends on the applied/received signals results. In the further input circuit shown in FIG. 1b, the current profile as a function of the input voltage is correspondingly reversed, with the result that a high supply current flows when outputting a low state potential and a low supply current flows when outputting a high state potential.

Figure 3:
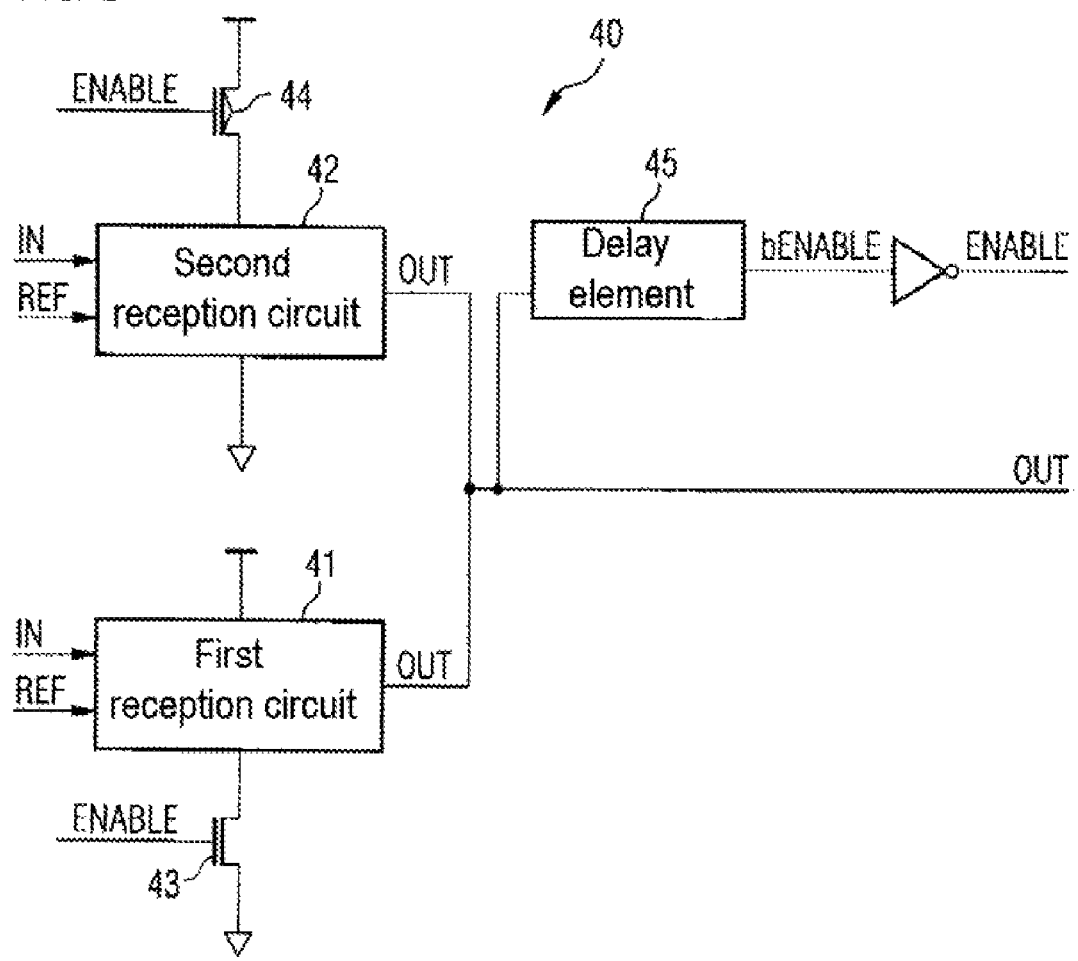
FIG. 3 shows a block diagram of an input circuit according to one embodiment of the invention.

FIG. 3 shows a block diagram of an input circuit 40 according to one embodiment of the invention. The input circuit 40 includes two reception circuits which are complementary to one another and have respectively different current consumption characteristics. By way of example, the reception circuit 1 shown in FIG. 1a and the reception circuit 21 shown in FIG. 1b may be utilized in the input circuit 40 since they have current consumption characteristics which are complementary to one another. The input circuit 40 shown in FIG. 3 therefore has a first reception circuit 41 having a first current consumption characteristic and a second reception circuit 42 having a second current consumption characteristic. Both of the reception circuits 41, 42 receive the same reference voltage $V_{REF}$, with respect to which the applied input signal is assessed.

The input signal is likewise applied to both reception circuits 41, 42. The first and second reception circuits 41, 42 are respectively connected to the supply voltage, via a first switch 43 and a second switch 44, respectively, in such a manner that they may be switched on or off. The first and second switches 43, 44 are driven in such a manner that only either the first reception circuit 41 or the second reception circuit 42 is connected to the supply voltage, so that connected reception circuit may respectively operate. The first and second switches 43, 44 may comprise field effect transistors which are complementary to one another. In one embodiment, the first switch is in the form of an n-channel field effect transistor, and the second switch 44 is in the form of a p-channel field effect transistor. A driven received signal which has been delayed and is taken from an output of the input circuit 40 is applied to the respective gate connections of the field effect transistors 43, 44. As a result of the complementary configuration of the first and second switches 43, 44, only one of the two switches 43, 44 (in the form of field effect transistors) is respectively turned on while the other is turned off. The current supply is thus interrupted by one of the reception circuits 41, 42.

An inverted drive signal may also be used to drive the first and second switches 43, 44. It is merely necessary to ensure that only one of the two switches 43, 44 is respectively turned on. The switch activates one of the reception circuits 41, 42 which requires the smaller supply current based on the input signal to be output.

For example, if the first reception circuit corresponds to the input circuit shown in FIG. 1a and the second reception circuit 42 corresponds to the input circuit shown in FIG. 1b, the second reception circuit is activated and the first reception circuit is deactivated in the case of a state potential of the input signal that is greater than the reference voltage. If a state potential that is less than the reference voltage is applied to the input IN, the first reception circuit 41 is activated while the second reception circuit 42 is deactivated. The first and second switches 43, 44 are switched in a delayed manner. A delay element 45 is provided which receives the driven input signal at the output OUT of the input circuit 40 and provides this signal, in a delayed manner, as a drive signal for the first and second switches 43, 44. The delay circuit 45 may provide the drive signal both in inverted form and in non-inverted form, with the result that it is respectively possible to implement the first and second switches 43, 44 using both n-channel field effect transistors and p-channel field effect transistors. Other components may be implemented or utilized as switches.

Figure 4A:
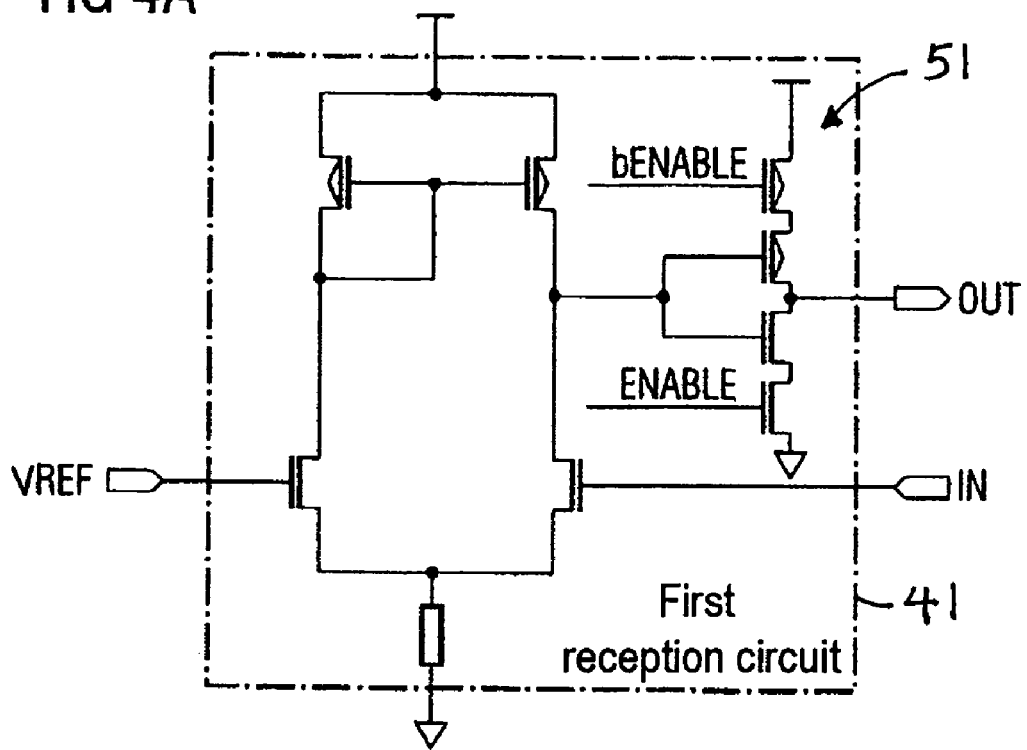
FIG. 4a shows a reception circuit in accordance with FIG. 1a having an activatable driver circuit for driving the input signal.
Figure 4B:
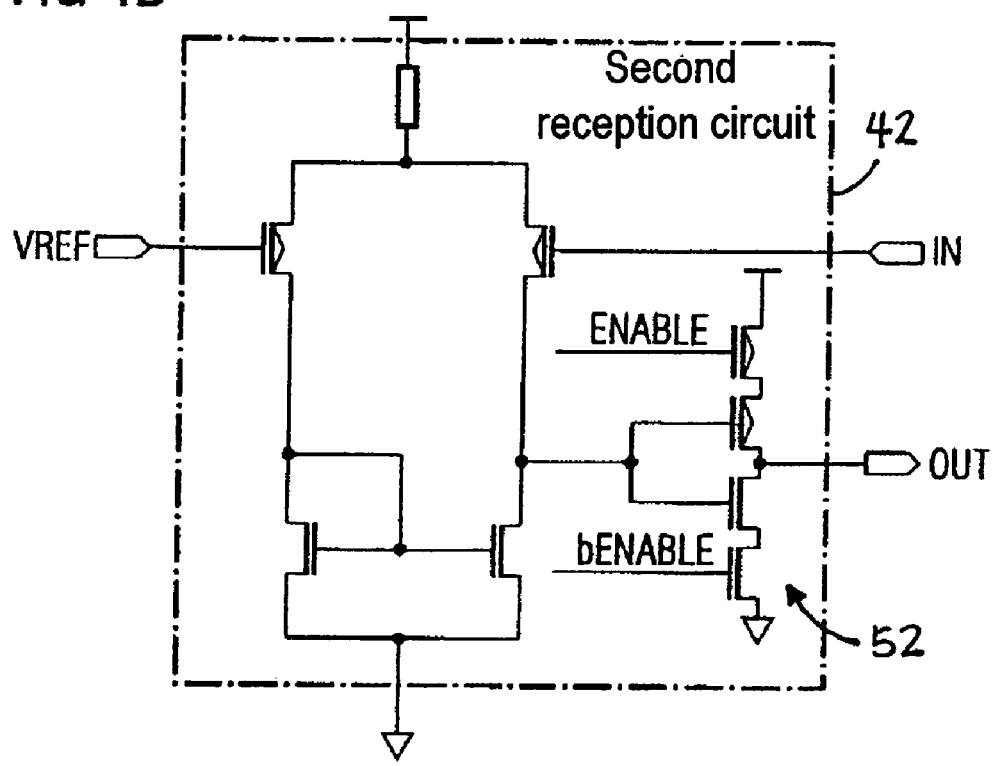
FIG. 4b shows a reception circuit in accordance with FIG. 1b having an activatable driver circuit for driving the input signal.

The reception circuits 41, 42 are connected to one another by their outputs, which constitutes the output of the input circuit 40. To prevent current from draining through the respective deactivated reception circuit when driving the received input signal, the reception circuits 41, 42 respectively have driver circuits which can be deactivated in such a manner that the respective output of the reception circuit 41, 42 is switched to high impedance when being deactivated. FIG. 4a shows, by way of example, such a driver circuit for the input circuit shown in FIG. 1a. The complementary driver circuit for the input circuit shown in FIG. 1b may be implemented in an analogous manner as shown in FIG. 4b. Both the first and second reception circuits 41, 42 therefore may have driver circuits 51, 52, respectively, which are, for example, in the form of a connected inverter. A connected inverter may have two p-channel field effect transistors and two n-channel field effect transistors which are connected in series between the high supply potential and the low supply potential. An inverted drive signal is used to drive one of the p-channel field effect transistors, and a non-inverted drive signal is used to drive one of the n-channel field effect transistors, with the result that the driver circuit is deactivated when the entire reception circuit is deactivated. Thus, the output of the respective reception circuit may be switched to high impedance when being deactivated without it being possible for a current path to the high or low supply potential to occur as a result of circuit parts which are not connected to a fixed potential (e.g., connected to a floating potential).

FIG. 5 shows the temporal sequence of activating the different reception circuits of the input circuit. Separating the input circuit into a part which detects the low-high edge of the input signal and a part which detects the high-low edge of the input signal makes it possible to set the timing properties of the input circuit separately from one another. As shown in FIG. 5, after the driven input signal has changed state, the reception circuit which interprets and assesses the applied input signal is also changed after a delay time, and the current consumption of the entire input circuit is thus reduced, by selecting the respective reception circuit which has the lower current consumption.

While the foregoing is directed to embodiments of the present invention, other and further embodiments of the invention may be devised without departing from the basic scope thereof, and the scope thereof is determined by the claims that follow.

What is claimed is:

1. An input circuit for an electronic circuit, comprising:
   a first reception circuit configured to receive an input signal and drive the received signal, the first reception circuit having a first current consumption characteristic, the current consumption of the first reception circuit depending on the input signal to be driven;
   a second reception circuit configured to receive the input signal and drive the received signal, the second reception circuit having a second current consumption characteristic which is different from the first current consumption characteristic, the current consumption of the second reception circuit depending on the input signal to be driven; and
   a control circuit configured to selectively activate one of the first reception circuit and the second reception circuit and deactivate the respective other reception circuit depending on the received input signal, wherein the control circuit comprises a delay element configured to delay respective activation of the first reception circuit and the second reception circuit for a predetermined delay time based on the driven input signal.

2. The input circuit of claim 1, wherein the control circuit further comprises a first switch for switching the first reception circuit and a second switch for switching the second reception circuit, the control circuit configured to selectively activate the respective reception circuit having a comparatively lower current consumption for the received input signal.

3. The input circuit of claim 1, wherein each of the first and second reception circuits includes a differential amplifier stage and a current mirror circuit, wherein the differential amplifier stage includes a reference voltage connection and an input signal connection and is configured to assess the input signal with respect to a reference voltage.

4. The input circuit of claim 3, wherein the differential amplifier stage of the first reception circuit comprises n-channel field effect transistors and the current mirror circuit of the first reception circuit comprises p-channel field effect transistors, and wherein the differential amplifier stage of the second reception circuit comprises p-channel field effect transistors and the current mirror circuit of the second reception circuit comprises n-channel field effect transistors.

5. The input circuit of claim 4, wherein the differential amplifier stage of the first reception circuit is connected to a low supply potential and the current mirror circuit of the first reception circuit is connected to a high supply potential, and wherein the differential amplifier stage of the second reception circuit is connected to the high supply potential and the current mirror circuit of the second reception circuit is connected to the low supply potential.

6. The input circuit of claim 5, wherein the first switch comprises an n-channel field effect transistor disposed between the low supply potential and the differential amplifier stage of the first reception circuit, and wherein the second switch comprises a p-channel field effect transistor disposed between the high supply potential and the differential amplifier stage of the second reception circuit.

7. The input circuit of claim 6, wherein a non-inverted driven input signal is utilized to control the first switch and the second switch.

8. The apparatus of claim 1, each reception circuit further comprises a driver circuit selectably switchable between an active state and an inactive state depending on the driven input signal.

9. The apparatus of claim 8, wherein the outputs of the respective driver circuits are connected to one another and wherein, in the inactive state, the respective output is set to a high impedance.

10. A method for receiving an input signal for an electronic circuit, comprising:
    receiving the input signal in a first reception circuit having a first current consumption which depends on the input signal to be driven;
    receiving the input signal in a second reception circuit having a second current consumption which depends on the input signal to be driven, wherein the second consumption is different from the first consumption; and
    selectively activating one of the first reception circuit and the second reception circuit based on the input signal and deactivating the respective other reception circuit, wherein the respective activation of the first reception circuit and the second reception circuit is delayed for a predetermined delay time based on the driven input signal.

11. The method of claim 10, wherein the selective activation and deactivation of respective reception circuits are controlled by a control circuit and wherein the respectively activated reception circuit has a comparatively lower current consumption for the input signal.

12. The method of claim 11, further comprising:
    comparing the received input signal against a reference potential.

13. The method of claim 12, further comprising:
    setting an output of the respective inactive reception circuit to a high impedance.

14. The method of claim 10, further comprising driving the input signal to a downstream circuit.

15. An input circuit for receiving an input signal for an electronic circuit, comprising:
    a first reception circuit having a first current consumption which depends on the input signal, wherein the first current consumption is at a low level for a low level input signal and is at a high level for a high level input signal;
    a second reception circuit having a second current consumption which depends on the input signal, wherein the second current consumption is at the high level for the low level input signal and is at the low level for the high level input signal, wherein each reception circuit comprises a differential amplifier circuit for comparing the input signal and a reference signal to determine whether the input signal is at the low level or the high level;
    a control circuit configured to activate the first reception circuit and deactivate the second reception circuit when the input signal is at the low level and to activate the second reception circuit and deactivate the first reception circuit when the input signal is at the high level; and
    a delay element configured to delay respective activation of the first reception circuit and the second reception circuit for a predetermined delay time based on the input signal.

16. The input circuit of claim 15, wherein each reception circuit further comprises a driver circuit selectably switchable between an active state and an inactive state depending on the input signal, wherein respective outputs of the respective driver circuits are connected to one another and wherein, in the inactive state, the respective output is set to a high impedance.

* * * * *